United States Patent
Shao et al.

(10) Patent No.: US 7,745,520 B2
(45) Date of Patent: Jun. 29, 2010

(54) HYBRID POLYMER LIGHT-EMITTING DEVICES

(75) Inventors: Yan Shao, Goleta, CA (US); Guillermo C. Bazan, Santa Barbara, CA (US); Alan J. Heeger, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 582 days.

(21) Appl. No.: 11/655,324

(22) Filed: Jan. 18, 2007

(65) Prior Publication Data

US 2008/0084158 A1 Apr. 10, 2008

Related U.S. Application Data (60) Provisional application No. 60/850,227, filed on Oct. 5, 2006.

(51) Int. Cl.
*C08K 5/19* (2006.01)
*C08K 5/3415* (2006.01)
*C08K 5/3445* (2006.01)

(52) U.S. Cl. ............ 524/106; 524/104; 524/115; 524/183; 524/186; 524/236; 524/500; 523/1

(58) Field of Classification Search ............ 252/301.35; 429/213; 524/86, 104, 115, 186, 236
See application file for complete search history.

(56) References Cited

U.S. PATENT DOCUMENTS

| | | | |
|---|---|---|---|
| 5,682,043 A | 10/1997 | Pei et al. | |
| 5,895,717 A | 4/1999 | Cao et al. | |
| 5,965,281 A | 10/1999 | Cao | |
| 6,284,435 B1 | 9/2001 | Cao | |
| 6,828,062 B2 * | 12/2004 | Lu et al. | 429/213 |
| 7,115,216 B2 | 10/2006 | Carter et al. | |
| 7,438,832 B2 * | 10/2008 | Majumdar et al. | 252/500 |
| 2006/0292736 A1 | 12/2006 | Lee et al. | |
| 2007/0215865 A1 * | 9/2007 | Liu et al. | 257/40 |
| 2007/0215879 A1 * | 9/2007 | Liu et al. | 257/79 |

OTHER PUBLICATIONS

Yang et al. (J. Phys. Chem. B 2003, 107, 12981-12988).*
Nature Materials, vol. 5, Jan. 2006, 69-74.*
Trifluorovinyl ether @ http://stc-mditr.org/outputs/annual_report2003/Ch-2.pdf (2003).*
J.H. Burroughes, D.D.C. Bradley, A.R. Brown, R.N. Marks, K. Mackay, R.H. Friend, P.L. Burns, A.B. Holmes, Nature 1990, 347, 539.
D. Braun, A.J. Heeger, Appl. Phys. Lett. 1991, 58, 1982.
H. Spreitzer, H. Becker, E. Kluge, W. Kreuter, H. Schenk, R. Schmidt and H. Schoo, Adv. Mater, 1998 10,1340.

(Continued)

*Primary Examiner*—David Wu
*Assistant Examiner*—Vu Nguyen
(74) *Attorney, Agent, or Firm*—Berliner & Associates (57) ABSTRACT

Mixtures and light-emitting devices that incorporate such mixtures are disclosed in which a soluble phenyl-substituted poly(para-phenylene vinylene) (PPV) copolymer ("superyellow") is used as the host light-emitting polymer and methyltrioctylammonium trifluoromethanesulfonate, an ionic liquid, is used to introduce a dilute concentration of mobile ions into the emitting polymer layer. These mixtures and devices incorporating them are able to combine some of the characteristics of polymer light emitting diodes (PLEDs) and polymer light-emitting electrochemical cells (PLECs).

5 Claims, 7 Drawing Sheets

OTHER PUBLICATIONS

X. Yang, D.C. Müller, D. Neher, K. Meerholz, Adv. Mater. 2006, 18, 948.

X. Gong, S. Wang, D. Moses, G.C. Bazan, A.J. Heeger, Adv. Mater. 2005, 17, 2053.

Q.B. Pei, G. Yu, C. Zhang, Y. Yang, A.J. Heeger, Science 1995, 269, 1086.

Q.B. Pei, Y. Yang, G. Yu, C. Zhang, A.J. Heeger, J. Am. Chem. Soc. 1996, 118, 3922.

J-H Shin, S. Xiao, L. Edman, Adv. Funct. Mater. 2006, 16, 949.

J. Gao, G. Yu, A.J. Heeger, Appl. Phys. Lett. 1997, 71, 1293.

Y. Cao, I.D. Parker, G. Yu, C. Zhang, A.J. Heeger, *Nature*, 1999, 397, 414.

Y. Xia, R.H. Friend, Adv. Mater. 2006, 18, 1371.

E. Aharon, A. Albo, M. Kalina, G.L. Frey, Adv. Funct. Mater. 2006, 16, 980.

J. Liu, Q.G. Zhou, Y.X. Cheng, Y.H. Geng, L.X. Wang, D.G. Ma, X.B. Jing, F.S. Wang, Adv. Funct. Mater. 2006, 16, 1957.

G. Yu, Y. Cao, M. Andersson, J. Gao, A.J. Heeger, Adv. Mater. 1998, 10, 385.

J.M. Leger, D.B. Rodovsky, G.P. Bartholomew, Adv. Mater. 2006, 18, 3130.

Y. Shao, G.C. Bazan, A.J. Heeger, Adv. Mater. 2007, 19, 365.

Y. Shao, Y. Yang, Adv. Funct. Mater. 2005, 15, 1781.

Y. Shao, Y. Yang, Appl. Phys. Lett. 2005, 86, 073510.

U. Mitschke, P. Bauerle, 1. Mater. Chern. 10, 1471 (2000).

L.S. Hung, C.H. Chen, Mater. Sci. & Eng. R 39, 143 (2002).

Y-H Niu, M.S. Liu, J-W Ka, J. Bardeker, M.T. Zin, R. Schofield, Y. Chi, and A.K.-Y. Jen, Adv. Mater. 19, 300 (2007).

Y. Takahashi, Y. Matsuoka, J. Mater. Sci. 23,2259 (1988).

Y-H Niu, M.S. Liu, J-W Ka, and A.K.-Y. Jen, Appl. Phys. Lett. 2006, 88, 093505.

S. Liu, X. Jiang, H. Ma, M.S. Liu, A.K.-Y. Jen, *Macromolecules*, 2000, 33, 3514.

J. Zhao, J.A. Bardecker, A.M. Munro, M.S. Liu, Y. Niu, I-K Ding, J. Luo, B. Chen, A.K.-Y. Jen, D.S. Ginger, Nano. Lett. 2006, 6, 463.

X. Jiang, S. Liu, M.S. Liu, P. Herguth, A.K.-Y. Jen, H. Fong, M. Sarikaya, Adv. Funct. Mater. 2002, 12, 745.

X. Gong, D. Moses, A.J. Heeger, S. Liu, A.K.-Y. Jen, Appl. Pyhs. Lett. 2003, 83, 183.

Y-H Niu, M.S. Liu, J-W Ka, J. Bardeker, M.T. Zin, R. Schofield, Y. Chi, and A.K.-Y. Jen, Adv. Mater. 2007, 19, 300.

A. Hayakawa, O. Yoshikawa, T. Fujieda, K. Uehara, S. Yoshikawa, Appl. Phys. Leu. 90, 163517 (2007).

L. Edman, M.A. Summers, S.K. Buratto, AJ. Heeger, Phys. Rev. B 70, 115212 (2004).

J.M. Leger, S.A Carter, B. Ruhstaller, 1. Appl. Phys. 98, 124907 (2005).

J. Dane, J. Gao, Appl. Phys. Lett. 85, 3905 (2004).

Y. Zhang, J. Gao, 1. Appl. Phys. 100, 084501 (2006).

F.P. Wenzl, P. Pachler, C. Suess, A Haase, EJ.W. List, P. Poelt, D. Somitsch, P. Knoll, U. Scherf, G. Leising, Adv. Funct. Mater. 14, 441 (2004).

J-H Shin, S. Xiao, A. Fransson, L. Edman, Appl. Phys. Leu. 87, 043506 (2005).

Y. Cao, G. Yu, AJ. Heeger, c.y. Yang, Appl. Phys. Leu. 68, 3218 (1996).

M.C. Gather, A Kohnen, A. Falcou, H. Becker, K. Meerholz, Adv. Mater. 17, 191 (2007).

S.A. Haque, S. Koops, N. Tokmoldin, I.R. Durrant, J. Huang, D.D. C. Bradley, E. Palomares, Adv. Mater. 19, 683 (2007).

J.C. deMello, N. Tessler, S.C. Graham, R.H. Friend, Phys. Rev. B 57, 12951 (1998).

J.Y. Kim, S.H. Kim, H.-H. Lee, K. Lee, W. Ma, X. Gong, AJ. Heeger, Adv. Mater. 18, 063502 (2006).

Niu, Y-H, et al., High-efficiency light-emitting diodes usinb neutral surfactants and aluminum cathode. Appl. Phys. Lett. 86, 083504 (2005).

Qui, C. et al., Comparative study of metal or oxide capped indium-tin oxide anodes for organic light-emitting diodes. J. Appl. Phjys. vol. 93 No. 6, Mar. 15, 2003).

Garbe, S, CsF, Cs as a low work function layer on the GaAs photocathode. Phys. Stat. Sol.(a)2, 497 (1970).

J. Gao, Y.F. Li, G. Yu, A.J. Heeger, J. Appl. Phys. 86, 4594 (1999).

Y. Kervella, M. Armand, O. Stephan, J. Electronchem. Soc. 148, H155 (2001).

Y. Cao, Q. Pei, M.R. Anderssson, G. Yu, A.J. Heeger, J. Electrochem. Soc. 144, L317 (1997).

C. Yang, Q. Sun, J. Qiao, Y. Li, J. Phys. Chem. B 107, 12981 (2003).

L. Edman, B. Liu, M. Vehse, J. Swensen, G.C. Bazan, A.J. Heeger, J. Appl. Phys. 98, 044502 (2005).

T-H Kim, H.K. Lee, O.O. Park, B.D. Chin, S-H Lee, J.K. Kim, Adv. Funct. Mater. 16, 611 (2006).

L.D. Bozano, K.R. Carter, V.Y. Lee, R.D. Miller, R. DiPietro, J.C. Scott, J. Appl. Phys. 94, 3061 (2003).

Y. Hu, C. Tracy, J. Gao, Appl. Phys. Lett. 88, 123507 (2006).

\* cited by examiner

MATS  superyellow

HYBRID POLYMER LIGHT-EMITTING DEVICES

RELATED APPLICATIONS

This application claims the benefit of U.S. Provisional Application No. 60/850227 filed on Oct. 5, 2006, which is incorporated herein by reference in its entirety.

FIELD OF THE INVENTION

The invention relates to polymer light-emitting devices.

BACKGROUND OF THE INVENTION

Polymer light-emitting devices have been divided into two general types: polymer light-emitting diodes (PLEDs) and polymer light-emitting electrochemical cells (PLECs) [1, 2, 3, 4, 5]. The advantages for PLEDs include fast response and relatively long operating lifetime (with proper packaging). However, low work function cathodes and/or thin interfacial layers (e.g. LiF) between the metal and the emitting polymer layer are required. In contrast, PLECs have relatively low turn-on voltages (approximately equal to the band gap of the luminescent semiconducting polymer), and low work function metals are not required.

One of the serious disadvantages of PLECs, however, is the slow response time (time required for the mobile ions to diffuse during junction formation). A solution to this problem is to "freeze" the junction after ion redistribution [6, 7]. A frozen junction system that operates at room-temperature is necessary for practical use. A limiting disadvantage of PLECs has been the relatively short lifetime compared with PLEDs [8, 9]. In order to combine the good characteristics of PLEDs and PLECs, a new type of emitting system was investigated comprising a luminescent polymer doped with a dilute concentration of an ionic liquid. High performance hybrid polymer light-emitting devices are reported here.

The major difference between PLEDs and PLECs is that the latter possess mobile ions inside the polymer; therefore, the selection of the mobile ions is one of the keys to fabricating high performance PLECs. Previously, the mobile ion systems that have been used fall into three categories. The first is polyethylene oxide (PEO) containing Li- salts [2, 3]. Crown ethers (and derivatives) [9, 10] have also been used in combination with metal salts. Finally, polymers with ionic side chains (polyelectrolyte conjugated polymers) have been used [11, 12,13]. For almost all PLECs, the additives comprise at least 5 weight percent (added for the required mobile ions). More important, these systems involve two-component phase separation with the emitting polymer in one phase and the mobile ions (e.g. dissolved in PEO) in a second phase. To create the p-i-n junction of the LEC, ions must move from one phase into the other; e.g. from the PEO into the luminescent polymer. This phase separation appears to degrade the device performance, especially the lifetime [10]. The phase separation can be attributed to the relatively poor compatibility of the ionic materials (hydrophilic) with host light-emitting polymers (hydrophobic). In order to reduce the phase separation, surfactants or bifunctional additives were introduced into the emitting layer and better performance was reported [14]. Single component PLECS polymers have been fabricated using luminescent polymers with ionic side chains (polyelectrolyte conjugated polymers), but the operating lifetimes were poor [11, 12,13].

BRIEF SUMMARY OF THE INVENTION

The present invention overcomes the foregoing drawbacks by providing hybrid polymer light-emitting devices that combine some of the characteristics of polymer light emitting diodes (PLEDs) and polymer light-emitting electrochemical cells (PLECs).

A soluble mixture is provided comprised of a single phase combination of a light-emitting polymer and a soluble ionic liquid.

The light emitting polymer of the present invention is a compound selected from the group consisting of phenyl-substituted poly(para-phenylene vinylene) (PPV) copolymer, and its derivatives substituted at various positions on the phenylene moiety, poly(2-methoxy-5-(2-ethylhexyloxy)-1,4-phenylene-vinylene) (MEH—PPV), polyfluorenylene (PF), poly(1,4-phenylene) (PP), and other derivatives.

The ionic liquid of the present invention is a compound selected from the group of toluene soluble ionic liquids consisting of methyltrioctylammonium trifluoromethanesulfonate, 1-Methyl-3-octylimidazolium octylsulfate, 1-Butyl-2,3-dimethylimidazolium octylsulfate, 1-octadecyl-3-methylimidazolium bis(trifluoromethylsulfonyl)imide, 1-octadecyl-3-methylimidazolium tris(pentafluoroethyl)trifluorophosphate, 1,1-dipropylpyrrolidinium bis(trifluoromethylsulfonyl)imide, trihexyl(tetradecyl)phosphonium bis(1,2-benzenediolato(2-)—O,O')borate, and N,N,N',N',N''-pentamethyl-N''propylguanidinium trifluoromethanesulfonate.

In a particular embodiment, a soluble phenyl-substituted poly(para-phenylene vinylene) (PPV) copolymer ("superyellow") was used as the host light-emitting polymer and methyltrioctylammonium trifluoromethanesulfonate, an ionic liquid, was used to introduce a dilute concentration of mobile ions into the emitting polymer layer.

In yet another embodiment of the invention, the mixture is comprised of a light-emitting polymer with about a 2% solution of an ionic liquid.

In one construction of the invention, a mixture is provided comprised of a combination of a light-emitting polymer, an ionic liquid with a melting temperature (Tm) of about 56° C. In other embodiments, a mixture is provided comprised of a combination of a light-emitting polymer, an ionic liquid with a melting temperature range of about 50° C. to 200° C. and a compound selected from a group consisting of high molecular weight polystyrene, Poly[[octahydro-5-(methoxycarbonyl)-5-methyl-4,7-methano-1H-indene-1,3-diyl]-1,2-ethanediyl] (POMME), and polymethyl methacrylate (PMMA).

In yet another construction, a mixture is provided comprised of a combination of a light-emitting polymer, an ionic liquid with a melting temperature range of about 50° C. to 200° C., and a compound with a Tg range from 80° C. to 300° C., where this compound is either a dendrimer selected from a group consisting of phenylvinylene dendrimer, alkylphenyl dendrimer, phenylphenyl dendrimer, phenylene dendrimer, carbazole dendrimer, and phenylazomethine dendrimer; or a cross linkable material selected from a group consisting of benzocyclobutene polymer/copolymer, pentadiene polymer/copolymer, and trifluorovinyl ether derivatives.

A light-emitting device is also provided that is comprised of a pair of electrodes, and an emitting polymer active layer between the pair of electrodes, the emitting polymer layer comprised of a combination of a light-emitting polymer and an ionic liquid.

In another embodiment, a light-emitting device is provided comprised of a pair of electrodes, and an emitting polymer active layer between the pair of electrodes, the emitting polymer layer comprised of a single phase combination of a light-emitting polymer and an ionic liquid, in which the device is formed by the process of precoating a glass substrate with indium-tin-oxide; spin-casting upon the indium-tin-oxide -coated glass substrate, a thin layer of soluble polymer; depositing onto the layer of soluble polymer, a layer of a solution comprising the host light-emitting polymer and the ionic liquid containing a concentration of mobile ions, and evaporating aluminum through a mask to form a cathode. In a particular embodiment, this light-emitting device has phenyl-substituted poly(para-phenylene vinylene) (PPV) copolymer as the light-emitting polymer, and methyltrioctylammonium trifluoromethanesulfonate as the ionic liquid.

A method for generating a useful level of light is provided comprised of applying a voltage across the anode and cathode of a light emitting-device comprising a pair of electrodes, and an emitting polymer active layer between the pair of electrodes, where the emitting polymer layer is comprised of a single phase combination of a light-emitting polymer and an ionic liquid, and detecting the light emitted from the device.

An advantage of the mixtures and light-emitting devices of the present invention are that they exhibit excellent current-rectification diode properties, short response time, a single-phase active layer, and long operating lifetime. Neither the use of a low work function metal nor an interfacial layer is required to achieve good electron injection from the cathode. The ions inside the luminescent semiconducting polymer can be redistributed by applying a voltage at a temperature above the melting point of the ionic liquid. After the frozen-junction has been established at room temperature, the devices can be turned on at a voltage approximately equal to the band gap of the semiconducting polymer; they exhibit fast response at room temperature with significantly improved performance.

The present invention overcomes the foregoing drawbacks by providing hybrid polymer light-emitting devices that combine some of the characteristics of polymer light emitting diodes (PLEDs) and polymer light-emitting electrochemical cells (PLECs). A soluble phenyl-substituted poly(para-phenylene vinylene) (PPV) copolymer ("superyellow") was used as the host light-emitting polymer and methyltrioctylammonium trifluoromethanesulfonate, an ionic liquid, was used to introduce a dilute concentration of mobile ions into the emitting polymer layer. Similar to PLEDs, they exhibit excellent current-rectification diode properties, short response time, a single-phase active layer, and long operating lifetime. Neither the use of a low work function metal nor an interfacial layer is required to achieve good electron injection from the cathode. The ions inside the luminescent semiconducting polymer can be redistributed by applying a voltage at a temperature above the melting point of the ionic liquid. After the frozen-junction has been established at room temperature, the devices can be turned on at a voltage approximately equal to the band gap of the semiconducting polymer; they exhibit fast response at room temperature with significantly improved performance.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1A:
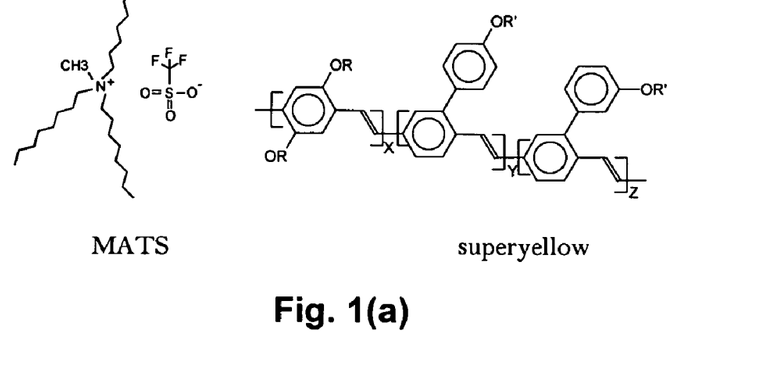
FIG. 1(a) shows the molecular structures of methyltrioctylammonium trifluoromethanesulfonate (MATS) and superyellow.

In the devices described here, we utilized the simplest sandwich structure for the device configuration with poly(3, 4-ethylenedioxythiophene)-poly(styrene sulfonate) (PEDOT-PSS) coated indium-tin-oxide (ITO) glass as the anode and aluminum as the cathode. A soluble phenyl-substituted poly(para-phenylene vinylene) (PPV) copolymer ("superyellow" from Merck KGaA, Frankfurter Str. 250, 64293 Darmstadt, Germany) was selected as our host light-emitting polymer and an organic ionic liquid, methyltrioctylammonium trifluoromethanesulfonate (MATS) was used to introduce a dilute concentration of mobile ions into the emitting polymer layer. The molecular structures of MATS and superyellow are shown in FIG. 1(a).

In other embodiments, light emitting polymers other than phenyl-substituted poly(para-phenylene vinylene) (PPV) copolymer, and its derivatives substituted at various positions on the phenylene moiety, can be used including, but not limited to poly(2-methoxy-5-(2-ethylhexyloxy)-1,4-phenylene-vinylene) (MEH-PPV), polyfluorenylene (PF), poly (1,4-phenylene) (PP), and other derivatives. In general, the derivatives can have alkyl, alkoxyl, phenyl, and phenoxyl groups.

In other embodiments, toluene soluble ionic liquids other than methyltrioctylammonium trifluoromethanesulfonate can be used including, but not limited to, 1-Methyl-3-octylimidazolium octylsulfate, 1-Butyl-2,3-dimethylimidazolium octylsulfate, 1-octadecyl-3-methylimidazolium bis(trifluoromethylsulfonyl)imide, 1-octadecyl-3-methylimidazolium tris(pentafluoroethyl)trifluorophosphate, 1,1-dipropylpyrrolidinium bis(trifluoromethylsulfonyl)imide, trihexyl(tetradecyl)phosphonium bis(1,2-benzenediolato(2-)—O,O')borate, and N,N,N', N', N"-pentamethyl-N" propylguanidinium trifluoromethanesulfonate.

The merits of MATS include its good solubility in common organic solvents, such as toluene, hexane, and acetonitrile, and its relatively high decomposition temperature (approximately 220° C.). Because MATS has a melting temperature of approximately 56° C., frozen junction devices can be prepared for operation at room temperature.

Other solvents can include 1,1-dichloroethane, 1,2-dichloroethane, dichloromethane, benzene, dialkylbenzene, dialkoxylbenzene, chloroform, hexane, cyclohexane, and cyclohexanone.

Figure 2A:
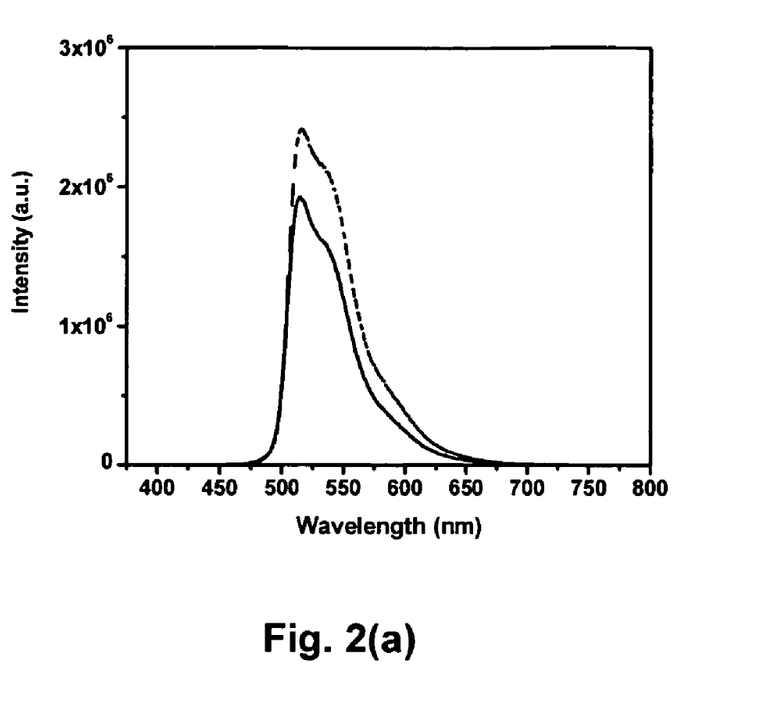
FIG. 2(a) is the photoluminescence spectra of 2 wt % MATS in superyellow (solid lines) and pure superyellow (dash lines) in 6 mg/ml toluene solution.
Figure 2B:
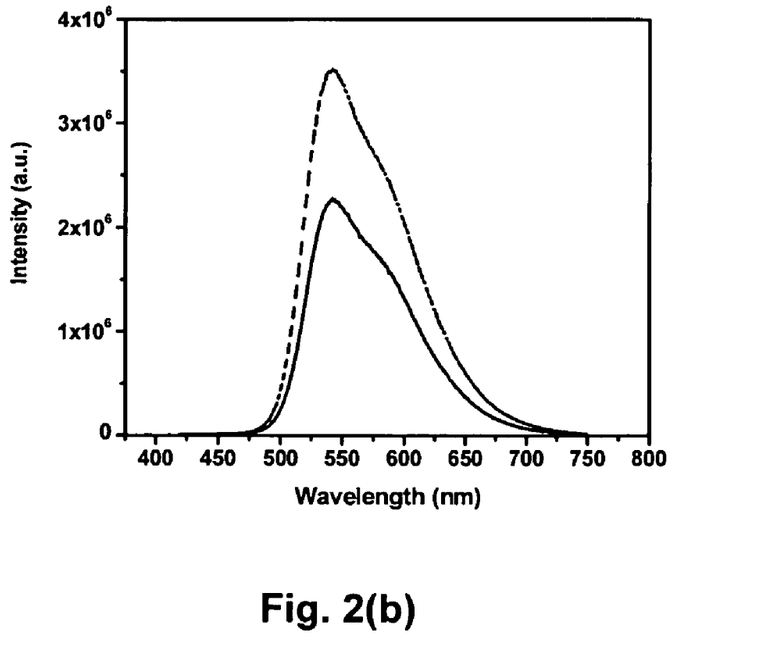
FIG. 2(b) is the photoluminescence spectra of 2 wt % MATS in superyellow (solid lines) and pure superyellow (dash lines) in solid thin films.

For device fabrication, the materials were used as received without further purification. MATS and superyellow were both dissolved into toluene at a weight ratio of 1:50 in a nitrogen-filled glove box (oxygen level under 3 ppm); the total concentration of the solution was 6 mg/ml. Solid thin films were prepared by spin casting from this solution in the glove box. Superyellow with 2% MATS shows strong photoluminescence (PL) both in solution and in the solid state with almost identical spectra. FIG. 2 shows the PL spectra of superyellow containing 2% MATS (solid lines) and pure superyellow (dash lines) both in solutions (FIG. 2(a)) and as solid thin films (FIG. 2(b)).

Figure 1B:
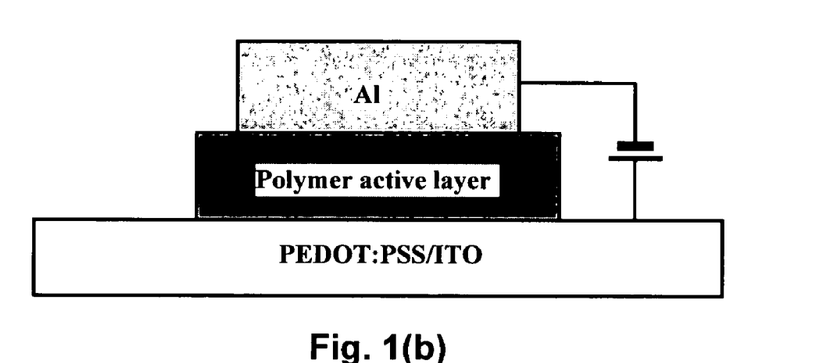
FIG. 1(b) is a schematic depiction of the device configuration.
Figure 1C:
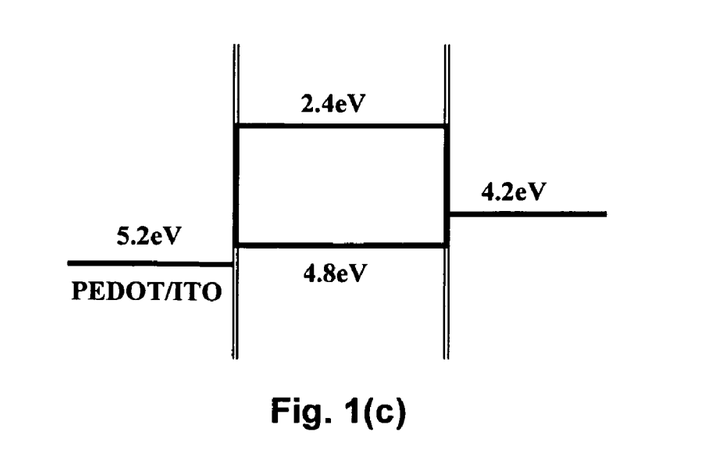
FIG. 1(c) is the schematic energy level diagram for the open circuit status.

Polymer light-emitting devices were fabricated on patterned ITO-coated glass substrates, which had been cleaned by successive ultrasonic treatment in detergent, acetone, and isopropyl alcohol. The ITO glass was then subjected to UV-ozone treatment for about 30 minutes. A thin layer of PEDOT-PSS film was spin-cast onto the ITO glass substrate with a spin speed of 4000 rpm for 1 minute and then baked at 120° C. for 20 minutes in ambient. The polymer layers were then spin-cast from the solution containing 1:50 weight ratio of MATS and superyellow in toluene with a speed of 1500 rpm for 1 minute in the nitrogen glove box. The Al cathode was evaporated through a shadow mask with an active area of approximately 14.8 mm$^2$ (deposition of the aluminum cathode was carried out under a base pressure of ~1×10$^{-6}$ Torr with deposition rates about 4 Å/s). Schematic diagrams of the device structure and the relevant energy levels of the various components (for open circuit conditions) are shown in FIGS. 1(b) and 1(c).

All the electrical measurements were performed under nitrogen in the glove box. The current-voltage (I-V) characteristics were recorded by a computer controlled Keithley 236 source-measure unit (SMU). When the devices were tested for the first time without any prior heat treatment, their behavior was just like that of a PLED with Al as cathode: the turn-on voltage was over 6 volts with relatively low brightness and low efficiency even at high operating voltage. Under 4V forward bias, the current was in the range of a few µA/cm$^2$. The electrical behavior was asymmetric (characteristic of a diode). Light emission was not observed in reverse bias.

When the devices were heated to around 80° C. under 4V forward bias, the current increased by a factor of approximately 2000 and reached 10 mA/cm$^2$ in about 1.5 minutes. The heating temperature was purposely chosen to be above the melting point of MATS and close to the glass transition temperature ($T_g$) of superyellow so that ions were generated and could move under the influence of the applied electrical field. The devices were subsequently cooled to room temperature under 4 V forward bias. After cooling, a frozen p-i-n junction was formed in the device. Experiments showed that the junction remained stable for more than 10 hours without application of an electrical field.

The devices demonstrated all characteristics of high performance PLEDs: high brightness, high efficiency, short response time, and long continuous operating time. In addition, they demonstrated the good characteristics of PLECs, including very low turn-on voltage with the use of a stable cathode material.

Figure 3A:
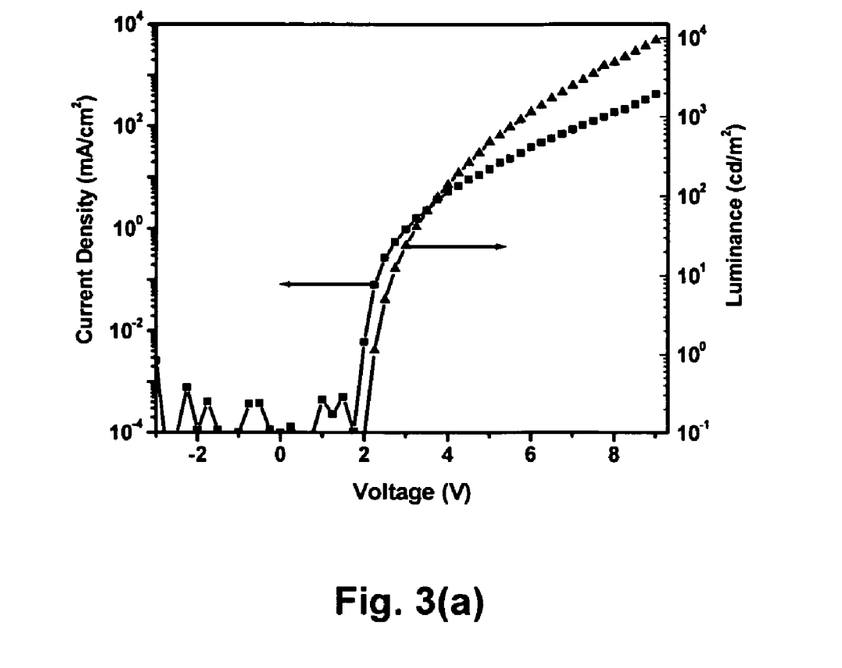
FIG. 3(a) shows current-voltage (I-V) and brightness-voltage (B-V) curves of device ITO/PEDOT/2 wt % MATS in superyellow/Al.
Figure 3B:
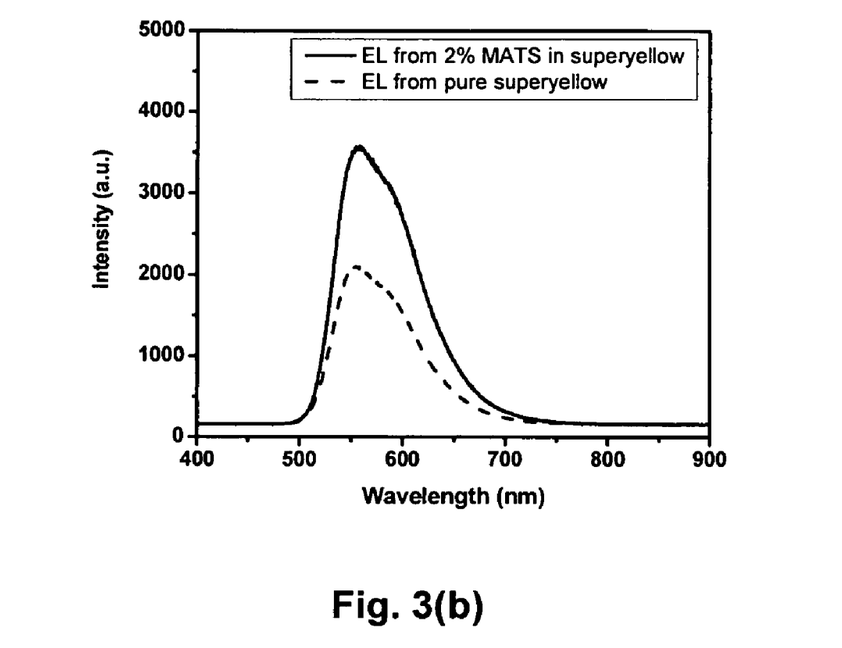
FIG. 3(b) is the electroluminescence spectra of the device with structure of ITO/PEDOT/2% MATS in superyellow/Al (solid line) and reference device with structure of ITO/PEDOT/superyellow/Al (dash line)

FIG. 3(a) shows the current-voltage (I-V) and brightness-voltage (B-V) curves. The turn-on voltages are as low as 2.2V (turn-on defined as the voltage required for achieving a brightness of 1 cd/m$^2$); i.e. approximately equal to the band gap of the superyellow semiconducting polymer. Leakage currents below turn-on are quite small. The brightness reached 10,000 cd/m$^2$ at around 9V. The light emission is from superyellow with almost identical electroluminescence (EL) spectrum as that obtained from the reference superyellow PLED (structure of ITO/PEDOT/superyellow/Al). The two spectra are shown in FIG. 3(b). The current-rectification ratio was typically greater than 10$^4$. The device efficiency was 3.3 cd/A.

The use of chemical additives is known to play an important role in electron injection, carrier transport, and exciton energy confinement [4, 15, 16,17]. When two or more materials are used in a blend, the material compatibility or mutual solubility is one of the keys to high performance devices, especially for long time operation [18, 19]. Therefore, the, proper selection of organic material components is an important issue.

Figure 4A:
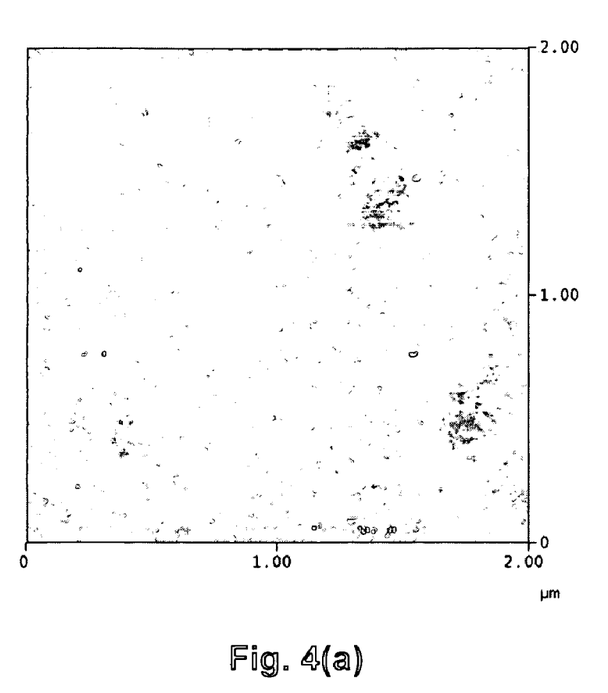
FIG. 4(a) is an atomic force microscope (AFM) picture for a thin film of 2 wt % MATS in superyellow.
Figure 4B:
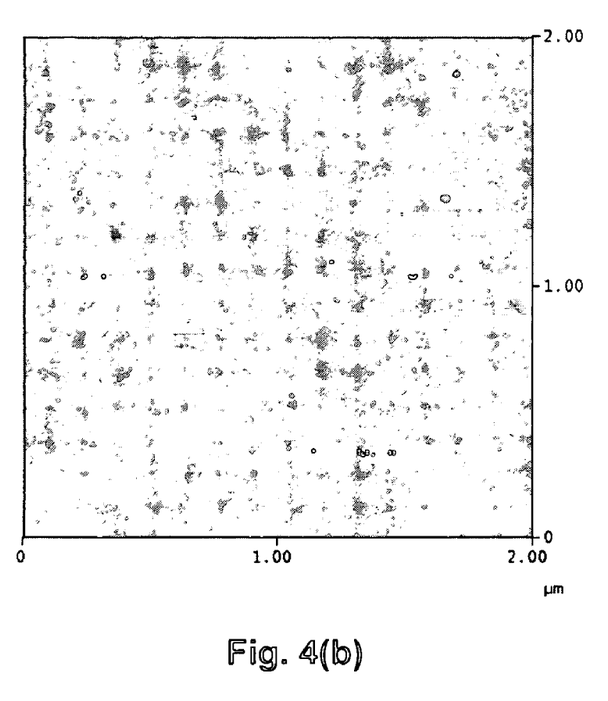
FIG. 4(b) is an AFM picture for a thin film of pure superyellow.

We find that MATS shows excellent compatibility with superyellow. This was confirmed by atomic force microscope (AFM) studies as shown in FIG. 4(a). FIG. 4(b) shows the AFM image of the control film of pure superyellow. Both were prepared on top of PEDOT-PSS coated ITO glass with a spin speed of about 1500 rpm and then baked on hot plate at 80° C. for about 25 minutes in the glove box. Then both films were stored in the glove box for about 12 days before measurement so that any possible phase separation can develop. Phase separation should be easily identified. In the AFM pictures, there is no evidence of phase separation. The two films show high surface quality and similar morphologies with similar uniformity, gain size, and height variation. The room-mean-square (RMS) roughness of both is about 0.7 nm, which means they remain quite smooth after relatively long time storage.

The single-phase nature means the system is thermodynamically stable, one of the key characteristics of stable material systems. Phase separation exists in almost all kinds of PLECs studied previously; including interpenetrating networks [14], needle-shaped fronts [12, 20], spherical aggregates [11], and large-scale topographical separation [21]. In our emitting layer, the MATS comprises only 2 weight percent in the solid thin films. As a result of the good solubility of MATS in superyellow, the films exhibited properties almost identical to those of pure superyellow films. The stability of this material system with the ionic liquid additive is the most important reason for the long operating lifetime of the devices.

Figure 5:
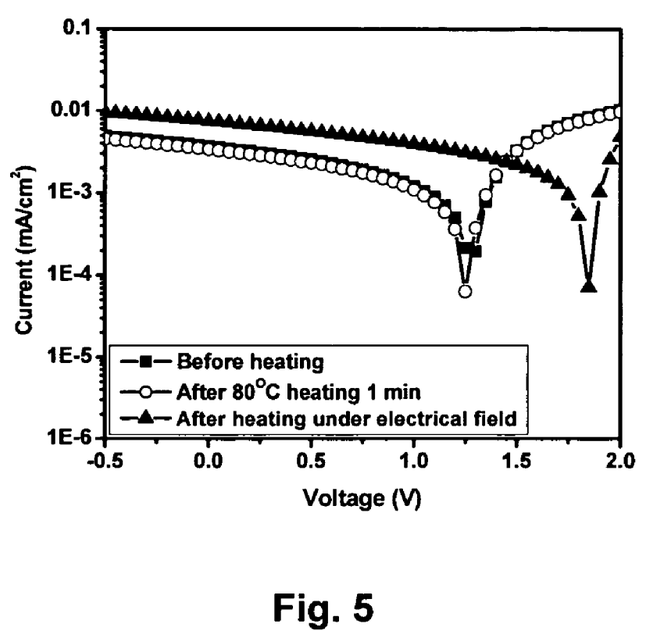
FIG. 5 shows current-voltage (I-V) curves of the photovoltaic effects of the devices before heating (solid square), after 80° C. heating for 1 minute (empty circle), and after 80° C. heating under 4V forward bias (solid triangle)

In order to investigate the origin of the diode junction inside the device during operation, photovoltaic effect measurements were performed and the open circuit voltages ($V_{oc}$), which provide information on the built-in potentials of the device, were recorded. The photocurrent was measured under AM 1.5 solar illumination at 100 mW/cm² (1 sun) in nitrogen glove box. FIG. 5 shows the current-voltage (I-V) curves of the photovoltaic effects before and after device operation. The original $V_{oc}$ of the devices is around 1.25V and there is almost no $V_{oc}$ change after thermal treatment at 80° C. for about 1 minute. The I-V curves of the devices before and after heating are nearly identical, which implies no chemical reaction between the Al cathode and the polymer active layer. The mobile ions were uniformly distributed in the whole polymer layer since there was no built-in electric field in the devices. The charging effect is obvious in the data; when devices were heated around 80° C. under 4V forward bias, the $V_{oc}$ increased by about 0.55 eV to 1.8 eV after charging and cooling down to room temperature. The measured $V_{oc}$ of about 1.8 eV is comparable to the band gap of the emitting polymer. As a result of the electrochemical doping near the anode and cathode interfaces, there are very small barriers for both electron and hole injection and consequently device turn-on voltages are very close to the band gap of the semi-conducting polymer [22]. This advantage reflects one of the most important characteristics of PLECs.

Figure 6:
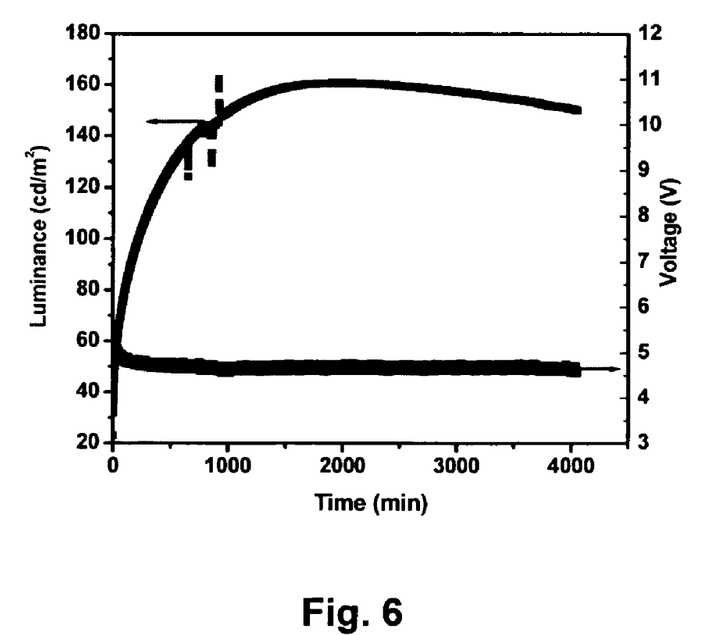
FIG. 6 shows brightness vs time for the ITO/PEDOT/2% MATS in superyellow/Al device.

One of the most important characteristics of the devices fabricated with the ionic liquid as the source of mobile ions is the long continuous operating lifetime even compared with regular PLEDs. The brightness vs time is shown in FIG. 6. Longer term lifetime measurements are underway.

The lifetime of this new type of hybrid light-emitting devices can be further enhanced by introducing high glass transition temperature, $T_g$, components into this system. This concept, well known in the field of poled nonlinear optical (NLO) materials [23] has been demonstrated as an effective method to obtain longer lifetimes for the hybrid light-emitting devices. The frozen junction after ion redistribution can also be stabilized by the addition of high $T_g$ components.

Compounds with suitable $T_g$ include, but are not limited to, high molecular weight polystyrene (PS), Poly[[octahydro-5-(methoxycarbonyl)-5-methyl-4,7-methano-1H-indene-1,3-diyl]-1,2-ethanediyl] (POMME), and polymethyl methacrylate (PMMA).

Figure 7A:
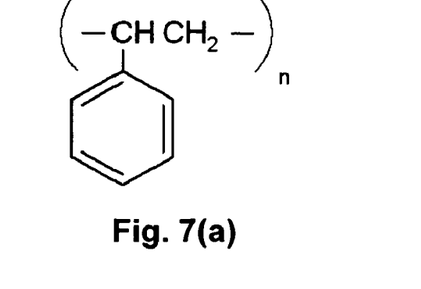
FIG. 7(a) shows the molecular structure of polystyrene (PS)
Figure 7B:
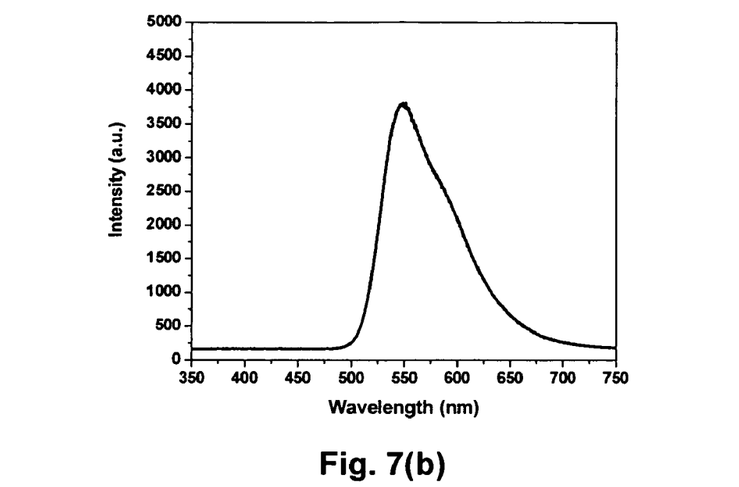
FIG. 7(b) is the EL spectrum of the device.
Figure 7C:
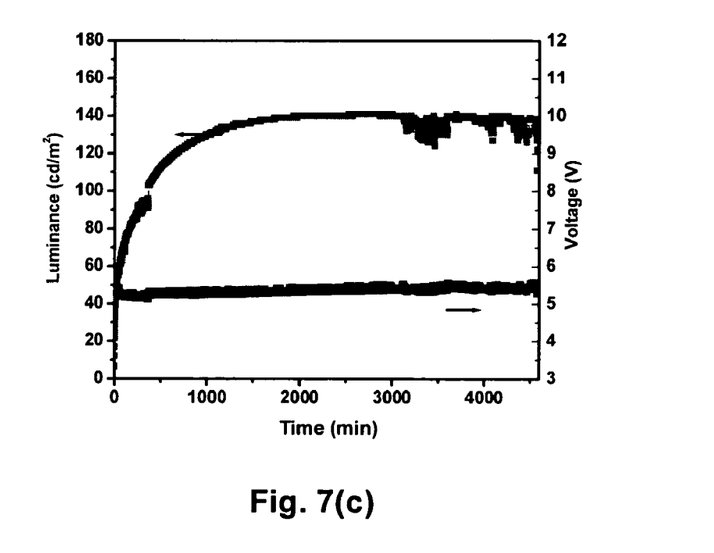
FIG. 7(c) shows brightness vs time for the ITO/PEDOT/ 1.6% MATS+20% PS in superyellow/Al device.

High molecular weight polystyrene (PS), MW 1×10⁶, has a glass transition temperature, $T_g$, of about 110° C. High molecular weight PS can be utilized to enhance the stability of the hybrid polymer light-emitting devices without introducing phase separation because the excellent compatibility of PS and superyellow. The high molecular weight PS was dissolved into toluene and then blended with previously described superyellow solution containing 2 wt % MATS. The weight ratio of PS and superyellow was 1:4 and consequently the weight percent of MATS in the solution was diluted to 1.6%. Thin film formation and device fabrication processes were exactly same as the methods described above. FIGS. 7(a) and (b), and (c), respectively, show the molecular structure of PS, the EL spectrum of the devices, and the brightness vs time. Again, longer term lifetime measurements are underway. Compared with FIG. 6, the continuous operating lifetime has been enhanced.

The addition of the PS into this system causes the EL spectrum to be shifted slightly toward the green; the half-width of the emitting spectrum was less than that without the addition of PS. This phenomenon can be understood as a solid solution concentration effect. The superyellow has been diluted in this system causing a reduction in aggregation and/or π-π stacking effects. Note that the PL intensity of a film with PS inside actually increases by about 30% compared that from a film without PS, but without significant change in either the half-width or the intensity of the shoulder peak (data not shown). The origin of these differences is not understood in detail, but generally relate to the reduction of any residual concentration quenching as a result of the dilution by the PS.

Figures 8A, 8B:
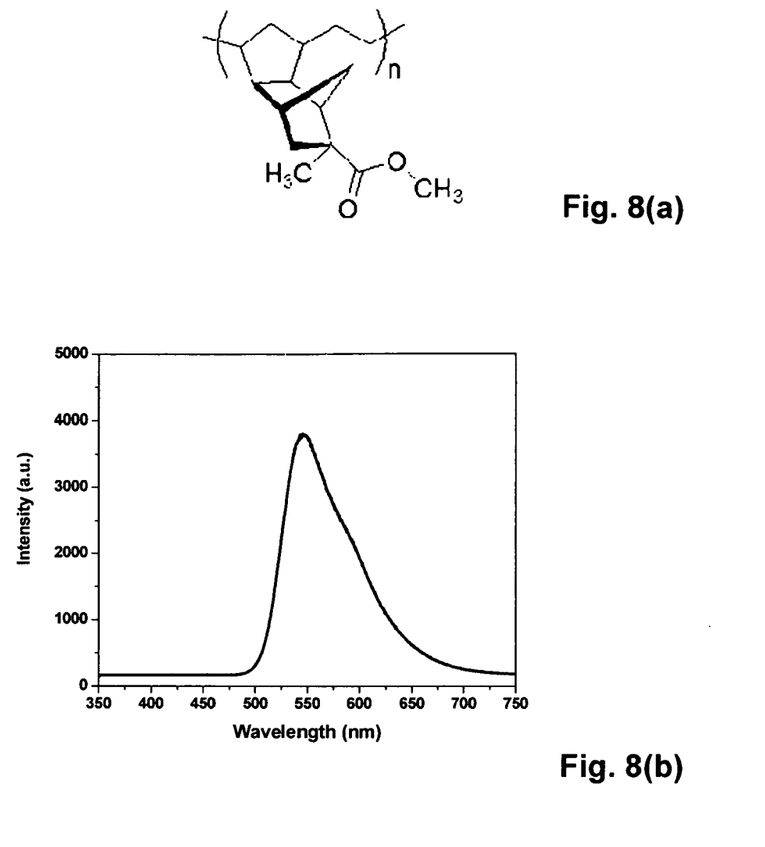
FIG. 8(a) shows the molecular structure of Poly[[octahydro-5-(methoxycarbonyl)-5-methyl-4,7-methano-1H-indene-1,3-diyl]-1,2-ethanediyl] (POMME)
FIG. 8(b) is the EL spectrum of the device.
Figure 8C:
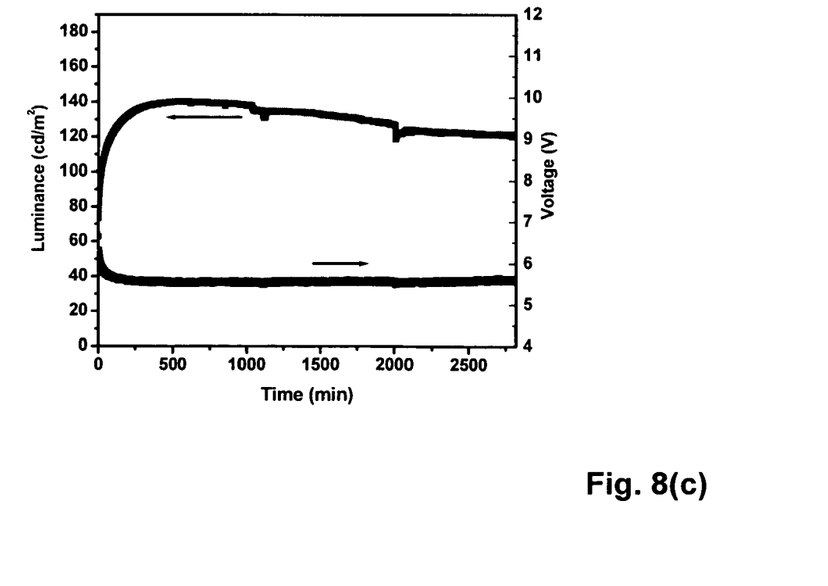
FIG. 8(c) shows brightness vs time for the ITO/PEDOT/ 1.5% MATS+25% POMME in superyellow/Al device.

Poly[[octahydro-5-(methoxycarbonyl)-5-methyl-4,7-methano-1H-indene-1,3-diyl]-1,2-ethanediyl] (POMME) is a polymer with high $T_g$ of approximately 160° C. POMME can also be dissolved into toluene and then blended into the superyellow solution containing 2 wt % MATS without phase separation. In our experiments, the weight ratio of POMME and superyellow was 1:3 and consequently the weight percent of MATS in the solution was diluted to 1.5%. The thin film and device fabrication followed the same procedure. FIGS. 8(a), 8(b) and 8(c), respectively, show the molecular structure of POMME, EL spectrum, and the brightness vs time. A hybrid polymer light-emitting device with 25% POMME has been continuously operated at constant voltage, unpackaged in a glove box, with initial brightness over 100 cd/m² for more than 2 months. During this period, the brightness decreased by less than 50%. The frozen junctions after ion redistribution are also more stable.

Additional methods for fabricating stable devices include the introduction of supermolecular structures; for example, dendrimers, or cross-linkable materials into the hybrid polymer light-emitting system. Because the dendrimers generally possess high $T_g$ and cross-linked materials can be considered as polymers with almost "infinitely" high $T_g$, long lifetimes can be expected. The frozen junction in the devices should also be stabilized by the addition of cross-linkable materials. There are many excellent candidate material systems known in the literature of organic nonlinear optics [23]. The ideas used for stabilizing the poled NLO materials are directly applicable to the hybrid polymer light-emitting devices. On the other hand, ionic liquids with higher melting points can also be introduced to improve the device stability, the continuous operating lifetime and the frozen junction inside the devices.

Dendrimers that can be used include, but are not limited to, phenylvinylene dendrimer, alkylphenyl dendrimer, phenylphenyl dendrimer, phenylene dendrimer, carbazole dendrimer, and phenylazomethine dendrimer. Cross-linkable materials that can be used include, but are not limited to, benzocyclobutene polymer or copolymer, pentadiene plymer and copolymer, and trifluorovinyl ether derivatives. In general, the derivatives can have alkyl, alkoxyl, phenyl, and phenoxyl groups.

As solvents, one can use organic solvent which, in addition to the aforementioned toluene, hexane and acetonitrile, can include 1,1-dichloroethane, 1,2-dichloroethane, dichloromethane, benzene, dialkylbenzene, dialkoxylbenzene, chloroform, hexane, cyclohexane, and cyclohexanone.

In summary, a new type of hybrid polymer light-emitting device has been demonstrated. These devices, with carefully chosen liquid electrolyte materials as additives, combine the characteristics of both PLEDs and PLECs. After the frozen junction is formed, the devices exhibit all the good characteristics of both PLEDs and PLECs including excellent current-rectification (>10⁴), fast response, high brightness (>10,000 cd/M²), high efficiency (>3.3 cd/A), low turn-on voltage (2.2V), stable Al cathodes, and long operating lifetimes.

Although the present invention has been described in connection with the preferred embodiments, it is to be understood that modifications and variations may be utilized without departing from the principles and scope of the invention, as those skilled in the art will readily understand.

REFERENCES

1. J. H. Burroughes, D. D. C. Bradley, A. R. Brown, R. N. Marks, K. Mackay, R. H. Friend, P. L. Burns, A. B. Holmes, Nature 347, 539 (1990).
2. Q. Pei, G. Yu, C. Zhang, Y. Yang, A. J. Heeger, Science 269, 1086 (1995).
3. Q. Pei, Y. Yang, G. Yu, C. Zhang, A. J. Heeger, J. Am. Chem. Soc. 118, 3922 (1996).
4. X. Gong, S. Wang, D. Moses, G. C. Bazan, A. J. Heeger, Adv. Mater. 17, 2053 (2005).
5. J. Liu, Q. G. Zhou, Y. X. Cheng, Y. H. Geng, L. X. Wang, D. G. Ma, X. B. Jing, F. S. Wang, Adv. Funct. Mater. 16, 957 (2006).
6. G. Yu, Y. Cao, M. Andersson, J. Gao, A. J. Heeger, Adv. Mater. 10, 385 (1998).
7. J. Gao, Y. F. Li, G. Yu, A. J. Heeger, J. Appl. Phys. 86, 4594 (1999).
8. J-H Shin, S. Xiao, A. Fransson, L. Edman, Appl. Phys. Lett. 87, 043506 (2005).
9. Y. Kervella, M. Armand, O. Stephan, J. Electronchem. Soc. 148, H155 (2001).
10. Y. Cao, Q. Pei, M. R. Anderssson, G. Yu, A. J. Heeger, J. Electrochem. Soc. 144, L317 (1997).
11. C. Yang, Q. Sun, J. Qiao, Y. Li, J. Phys. Chem. B 107, 12981 (2003).
12. J-H Shin, S. Xiao, L. Edman, Adv. Funct. Mater. 16, 949 (2006).
13. L. Edman, B. Liu, M. Vehse, J. Swensen, G. C. Bazan, A. J. Heeger, J. Appl. Phys. 98, 044502 (2005).
14. Y. Cao, G. Yu, A. J. Heeger, C. Y. Yang, Appl. Phys. Lett. 68, 3218 (1996).
15. Y. Hamada, H. Kanno, T. Tsujioka, H. Takahashi, T. Usuki, Appl. Phys. Lett. 75, 1682 (1999).
16. Y. Shao, Y. Yang, Appl. Phys. Lett. 86, 073510 (2005).
17. T-H Kim, H. K. Lee, O. O. Park, B. D. Chin, S-H Lee, J. K. Kim, Adv. Funct. Mater. 16, 611 (2006).
18. L. D. Bozano, K. R. Carter, V. Y. Lee, R. D. Miller, R. DiPietro, J. C. Scott, J. Appl. Phys. 94, 3061 (2003).
19. Y. Shao, Y. Yang, Adv. Funct. Mater. 15, 1781 (2005).
20. Y. Hu, C. Tracy, J. Gao, Appl. Phys. Lett. 88, 123507 (2006).
21. F. P. Wenzl, P. Pachler, C. Suess, A. Haase, E. J. W. List, P. Poelt, D. Somitsch, P. Knoll, U. Scherf, G. Leising, Adv. Funct. Mater. 14, 441 (2004).
22. L. Edman, M. A. Summers, S. K. Buratto, A. J. Heeger, Phys. Rev. B 70, 115212 (2004).
23. F. Kajzar, K-S Lee, A. K-Y. Jen, "Polymeric Materials and their Orientation Techniques for Second-Order Nonlinear Optics" in book of "Advances in Polymer Science", Volume 161, Springer Berlin/Heidelberg (2003).

The invention claimed is:

1. A mixture comprising a single phase combination of a light-emitting polymer and an ionic liquid soluble in the polymer, wherein said ionic liquid is a compound selected from the group consisting of methyltrioctylammonium trifluoromethanesulfonate, 1-Methyl-3-octylimidazolium octylsulfate, 1-Butyl-2,3-dimethylimidazolium octylsulfate, 1-octadecyl-3-methylimidazolium bis(trifluoromethylsulfonyl)imide, 1-octadecyl-3-methylimidazolium tris(pentafluoroethyl)trifluorophosphate, 1,1-dipropylpyrrolidinium bis(trifluoromethylsulfonyl)imide, trihexyl(tetradecyl)phosphonium bis(1,2-benzenediolato (2-)-O,O')borate, and N,N,N',N',N"-pentamethyl-N"propylguanidinium trifluoromethanesulfonate.

2. The mixture of claim 1, wherein the ionic liquid is methyltrioctylammonium trifluoromethanesulfonate.

3. The mixture of claim 2, wherein the light-emitting polymer is a phenyl-substituted poly(para-phenylene vinylene) (PPV) copolymer.

4. A mixture comprising a single phase combination of a light-emitting polymer and an ionic liquid soluble in the polymer, further comprising a compound with a $T_g$ range from 80° C. to 300° C.

5. The mixture of claim 4, wherein the compound is selected from a group consisting of benzocyclobutene homopolymer, benzocyclobutene copolymer, pentadiene homopolymer and copolymer, and trifluorovinyl ether derivatives.

* * * * *